(12) United States Patent
Pandey et al.

(10) Patent No.: US 7,620,918 B2
(45) Date of Patent: ***Nov. 17, 2009

(54) METHOD AND SYSTEM FOR LOGIC EQUIVALENCE CHECKING

(75) Inventors: Manish Pandey, San Jose, CA (US); Yung-Te Lai, Cupertino, CA (US); Bret Siarowski, Marlborough, MA (US); Kei-Yong Khoo, Berkeley, CA (US); Chih-Chang Lin, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 4 days.

This patent is subject to a terminal disclaimer.

(21) Appl. No.: 11/847,177

(22) Filed: Aug. 29, 2007

(65) Prior Publication Data

US 2007/0294649 A1    Dec. 20, 2007

Related U.S. Application Data

(62) Division of application No. 10/656,801, filed on Sep. 4, 2003, now Pat. No. 7,266,790.

(60) Provisional application No. 60/453,084, filed on Mar. 7, 2003.

(51) Int. Cl.
   *G06F 17/50* (2006.01)
(52) U.S. Cl. .............................. 716/4; 716/3
(58) Field of Classification Search ............... 716/3–6
   See application file for complete search history.

(56) References Cited

U.S. PATENT DOCUMENTS

| 5,754,454 | A   |   | 5/1998  | Pixley et al.            |
|-----------|-----|---|---------|--------------------------|
| 6,301,687 | B1  | * | 10/2001 | Jain et al. ....... 716/3 |
| 6,408,424 | B1  |   | 6/2002  | Mukherjee et al.         |
| 6,449,750 | B1  | * | 9/2002  | Tsuchiya ....... 716/4    |
| 6,457,162 | B1  |   | 9/2002  | Stanion                  |
| 6,473,884 | B1  |   | 10/2002 | Ganai et al.             |
| 6,742,174 | B1  | * | 5/2004  | Chen et al. ...... 716/18 |
| 6,931,611 | B2  |   | 8/2005  | Martin et al.            |
| 6,993,730 | B1  |   | 1/2006  | Higgins et al.           |

OTHER PUBLICATIONS

Beatty, D.L. et al. "Fast Incremental Circuit Analysis Using Extracted Hierarchy" Proceedings of the 25th ACM/IEEE Conference on Design Automation, Atlantic City, NJ, 1988, pp. 495-500.
Burch, J.R. et al. "Tight Integration of Combinational Verification Methods" Proceedings of the 1998 International Conference on Computer-Aided Design (ICCAD 98), San Jose, CA, 1998, pp. 570-576.

(Continued)

*Primary Examiner*—Jack Chiang
*Assistant Examiner*—Binh C Tat
(74) *Attorney, Agent, or Firm*—Vista IP Law Group, LLP (57) ABSTRACT

Some embodiments relate to a method and apparatus for performing logic equivalence checking (EC) of circuits using adaptive learning based on a persistent cache containing information on sub-problems solved from previous equivalency checking runs. These sub-problems can include basic EC tasks such as logic cone comparison and/or state element mapping.

25 Claims, 5 Drawing Sheets

OTHER PUBLICATIONS

Ebeling, C. et al. "Validating VLSI Circuit Layout by Wirelist Comparison" Proceedings of the International Conference on Computer-Aided Design (ICCAD 83), Santa Clara, CA, Sep. 12-15, 1983, pp. 172-173.

Fielding, R. et al., "Hypertext Transfer Protocol—HTTP/1.1", Jun. 1998, located at www.ietf.org/rfc/rfc2616.txt.

Gupta, A. "Formal Hardware Verification Methods: A Survey" Formal Methods in System Design, 1992, vol. 1., pp. 151-238.

Kato, K. "Persistent Caching: An Implementation Technique for Complex Objects with Object Identity" IEEE Transactions on Software Engineering, Jul. 1992, vol. 18, No. 7, pp. 631- 645.

Kuehlmann, A. et al. "Equivalence Checking Using Cuts and Heaps" Proceedings of 34th Annual Design Automation Conference (DAC 97), Anaheim, CA, Jun. 1997, pp. 263-268.

Kunz, W. "Hannibal: An Efficient Tool for Logic Verification Based on Recursive Learning" Proceedings of 1993 International Conference on Computer-Aided Design (ICCAD 93), Santa Clara, CA, Nov. 1993, pp. 538-543.

Liskov, B. et al. "Providing Persistent Objects in Distributed Systems" Proceedings of the 13th European Conference on Object-Oriented Programming (ECOOP 99) Jun. 1999, 28 pages.

Moskewicz, M. "CHAFF: Engineering an Efficient SAT Solver" Proceedings of the 38th Design Automation Conference (DAC 01), Las Vegas, NV, Jun. 2001, 6 pages.

Smith, B. et al. "Exploiting Result Equivalence in Caching Dynamic Web Content", The 2nd USENIX Symposium on Internet Technologies and Systems (USITS 99), Boulder, CO, Oct. 11-14, 1999, 12 pages.

Non-Final Office Action dated Jan. 9, 2009 for U.S. Appl. No. 11/847,187.

* cited by examiner

METHOD AND SYSTEM FOR LOGIC EQUIVALENCE CHECKING

CROSS-REFERENCE TO RELATED APPLICATIONS

This application is a divisional of U.S. patent application Ser. No. 10/656,801, filed on Sep. 4, 2003, now U.S. Pat. No. 7,266,790, and claims the benefit of priority of U.S. Provisional Application 60/453,084, filed on Mar. 7, 2003 which are incorporated herein by reference in their entireties.

BACKGROUND OF THE INVENTION

Equivalence checking (EC) can be performed between circuits such as combinational and/or sequential logic circuits. Many design flows involve a large number of EC runs on the same two designs, often with only local or incremental changes to one or both designs. Local or incremental design changes can mean that from one EC run to the next, many of the same common logic cone pairs are being compared.

To date, most effort has been spent on improving the compare and mapping algorithms themselves.

It would be desirable to take advantage of similarities with past multiple equivalence checking runs to speed up equivalence checking.

BRIEF SUMMARY OF THE INVENTION

Methods and apparatuses for circuit equivalence checking are disclosed.

In one method, at least a first equivalence checking problem is solved, such as comparing logic cones, determining one or more sensitizing simulation vectors, and/or mapping state elements. At least a first solution to the first equivalence checking sub-problem is stored. The first solution to the first equivalence checking sub-problem is reused for a second equivalence checking problem.

DETAILED DESCRIPTION OF THE INVENTION

Persistent caches are used to improve the performance of computer programs in many applications. For example, web browsers such as Netscape and Internet Explorer use persistent caching by saving the HTML files and graphics received over the network onto the local hard disk. When one accesses the files later, instead of having to access the files again over the network, they are available on the hard drive already, minimizing the page access time. Persistent caches are also used for accelerating the performance of distributed systems. For example, a persistent cache can be used for storing transistor-level analysis results for channel connected components (CCC). Prior to analysis of any CCC, the cache is checked for existing analysis results are immediately available in the cache, obviating the need to run potentially expensive analysis algorithms on the CCC. One protocol allows a web application to specify the use of cache and exploit result equivalence between the different objects the application generates.

Some embodiments perform logic equivalence checking (EC) of circuits using adaptive learning based on a persistent cache which can use a database. The cache stores information on sub-problems solved during previous EC runs. The "persistence" of the cache between EC runs ensures that past sub-problem runs and results information is stored in memory, and that these results are available to help speed up future EC runs.

The persistent cache contains at least two distinct classes of information. A first class of information is the characteristic of the problem being solved, which is termed as the problem signature. A second class of information is the characteristic of the algorithms used to solve the problem, which includes the specific algorithms used, values at intermediate points in the algorithm, and/or the final results obtained, which is termed the algorithm trace.

By maintaining the problem signature and/or the algorithm trace in a persistent cache, EC can be sped up by reusing results from sub-problems solved in earlier runs.

Determining that two designs implement equivalent finite state machines (FSMs) is a fundamental step in the design and verification of digital circuit systems. This task is performed by logic equivalence checkers, which verify the equivalence of two designs, which have identical state encoding. The terms equivalent or equivalence in the context of designs refers to equivalent FSMs. In the context of logic cones (described below), these terms refer to combinational equivalence.

Figure 1:
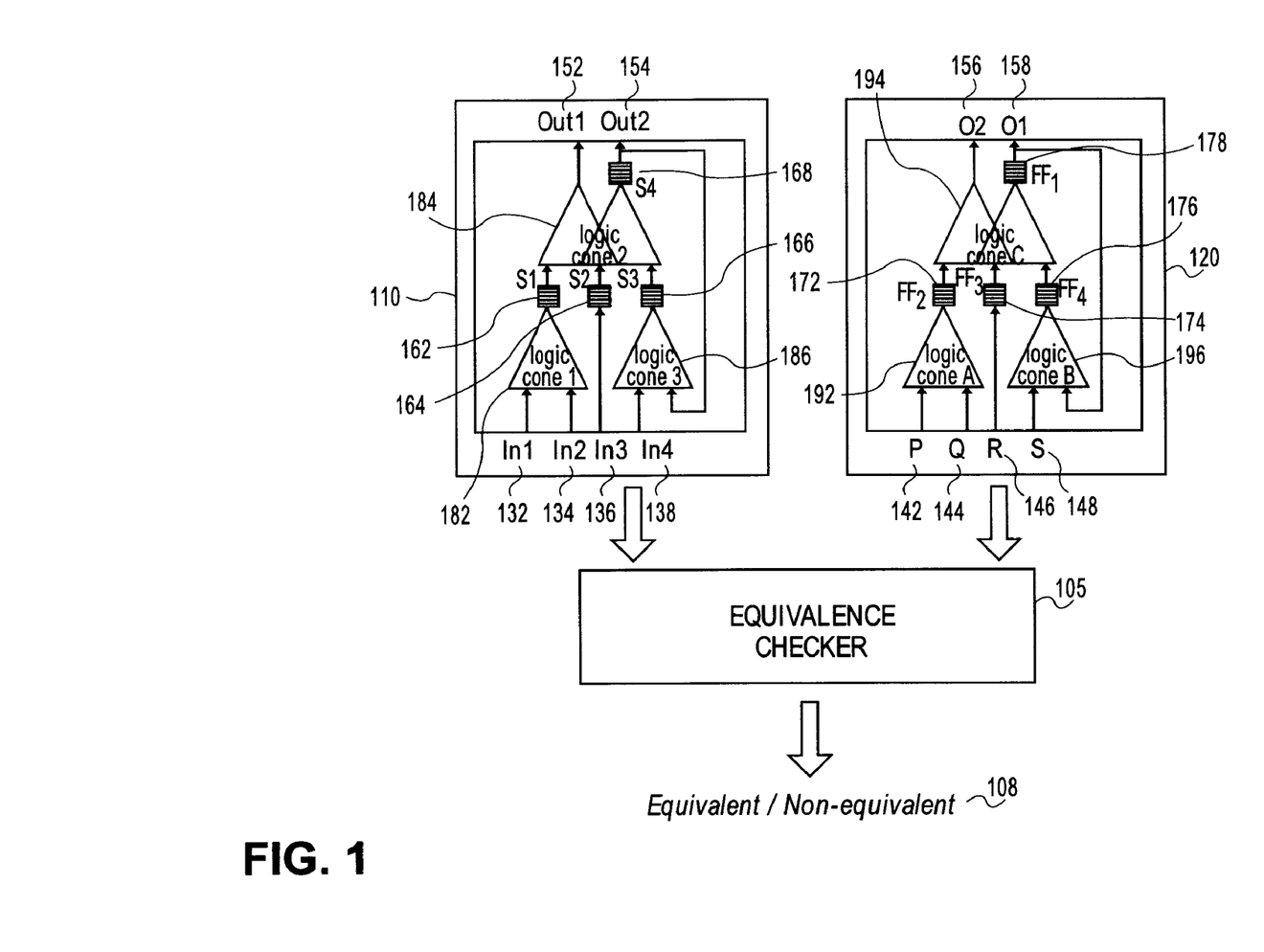
FIG. 1 illustrates the comparison of two designs, Design 1 and Design 2, which have identical state encoding.

FIG. 1 illustrates the comparison of two designs, Design 1 110 and Design 2 120, which have identical state encoding. Design 1 primary inputs {In1 132, In2 134, In3 136, In4 138} correspond to in Design 2 primary inputs {P 142, Q 144, R 146, S 148}. The primary outputs {Out1 152, Out2 154} in Design 1 110 correspond to primary outputs {O2 156, O2 158} in Design 2 120. The Design 1 registers {S1 162, S2 164, S3 166, S4 168} correspond to the Design 2 registers {FF2 172, FF3 174, FF4 176, FF1 178}.

The state elements and the primary inputs and outputs partition a design into logic cones. Logic cones are groups of combinational logic bordered by registers, and primary inputs and outputs. Design 1 110 contains three logic cones, shown as logic cone 1 182, logic cone 2 184, and logic cone 3 186, which are delineated by the primary inputs/outputs and the registers. Design 2 120 contains three logic cones, shown as logic cone A 192, logic cone B 196, and logic cone C 194, which are delineated by the primary inputs/outputs and the registers. Note that logic cone 2 184 and logic cone C 194 are multi-output logic cones.

Showing that two designs with identical state encoding are equivalent requires that the corresponding logic cones of the two designs be shown combinationally equivalent. Verifying the equivalence of Design 1 110 and Design 2 120 requires proving the 3 pairs of logic cones {logic cone 1 182, logic cone A 192}, {logic cone 2 184, logic cone C 194} and {logic cone 3 186, logic cone 196} equivalent. The comparison can be performed with equivalence checker 105, to produce a determination of equivalence or non-equivalence 108.

Figure 2:
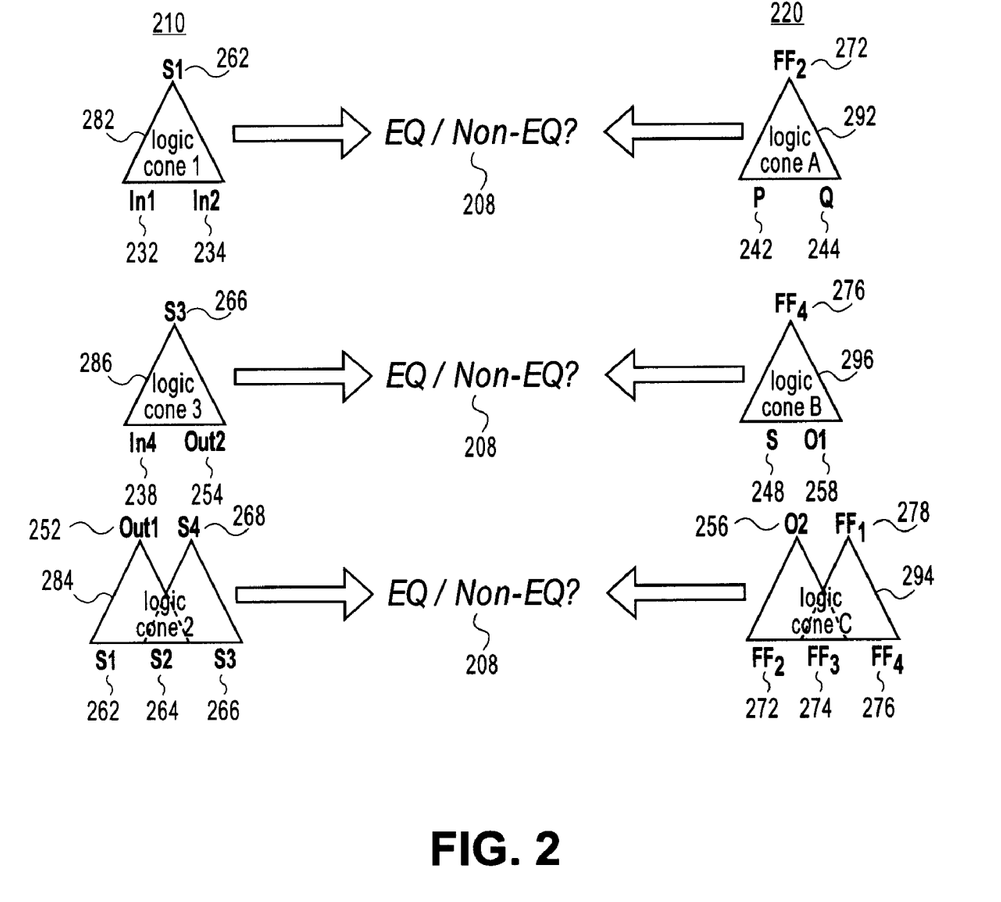
FIG. 2 illustrates verifying the equivalence of Design 1 and Design 2, proving the pairs of logic cones to be equivalent or non-equivalent.

Illustrated in FIG. 2 is the comparison of the logic cones of multiple designs. The left column 210 includes logic cones from a first design. The left column 210 includes logic cone 1 282 (with primary inputs In1 232 and 1n2 234 and register S1

262), logic cone 3 286 (with primary input In4 238, primary output 254, and register S3 266), and logic cone 2 284 (with registers S1 262, S2 264, S3 266, and S4 268; and primary output Out1 252). The right column 220 includes logic cones from a second design. The right column 220 includes logic cone A 292 (with primary inputs P 242 and Q 244 and register FF2 272), logic cone B 296 (with primary input S 248, primary output O1 258, and register FF4 276), and logic cone C 294 (with registers FF1 278, FF2 272, FF3 274, and FF4 276; and primary output O2 256). As part of equivalence checking equivalence or non-equivalence is determined 208 between the pairs of logic cones.

Comparison and Caching of Logic Cones

This problem of determining the combinational equivalence of two logic cones is a fundamental Boolean comparison problem that is solved by equivalence checkers. This problem can be solved more efficiently using a variety of techniques such as Binary Decision Diagrams (BDDs), Satisfiability Solvers (SAT), Automatic Test Pattern Generators (ATPG), and/or random simulation. These techniques are applied individually or in combination, and attempt to create the right recipe of the techniques to minimize the time and/or memory resources required to do a Boolean comparison of the logic cones.

Depending on the design size, each run of an equivalence checker tests for equivalence of tens to hundreds of thousands of logic cone pairs. This comparison process can be quite time and/or memory intensive. By maintaining a persistent cache of previously compared logic cones, the number of logic cones for which compare algorithms need to be actually run can be minimized. The problem signature in this case could be the result of, for example, a hash function applied to the structure of the two logic cones, and the algorithm trace contains the list and/or order of algorithms used for comparing the two cones, and/or the algorithm intermediate values and/or final results.

Other EC Sub-Problems

Caching is amenable to other EC sub-problems such as determining sensitizing simulation vectors for logic cones, and/or for state point mapping. A common problem that needs to be solved in many different phases of an EC run is that of determining a specific simulation vector that sensitizes the output of a logic cone. Determining the exact vector the first time may require simulating tens to hundreds of vectors, but once the vector has been discovered, it can be cached with the logic cone or a signature of the logic cone and used during later EC runs. The problem signature in this case could be the result of a hash function applied to the structure of the given logic cones, and the algorithm trace simply contains the specific simulation vector.

State point mapping information including state point pairs, signatures of supporting logic cones, and/or algorithm traces used to perform mapping can be cached during one EC run, and reused in part or full during subsequent EC runs. Incremental changes in the design will allow the verification and reuse of a significant amount of previous state mapping information. The problem signature in this case can be based on state point name pairs and/or the signatures of the driving logic cones. The algorithm trace can contain the specific mapping algorithm that enabled mapping of the specific state point pair.

DESCRIPTION

Figure 3:
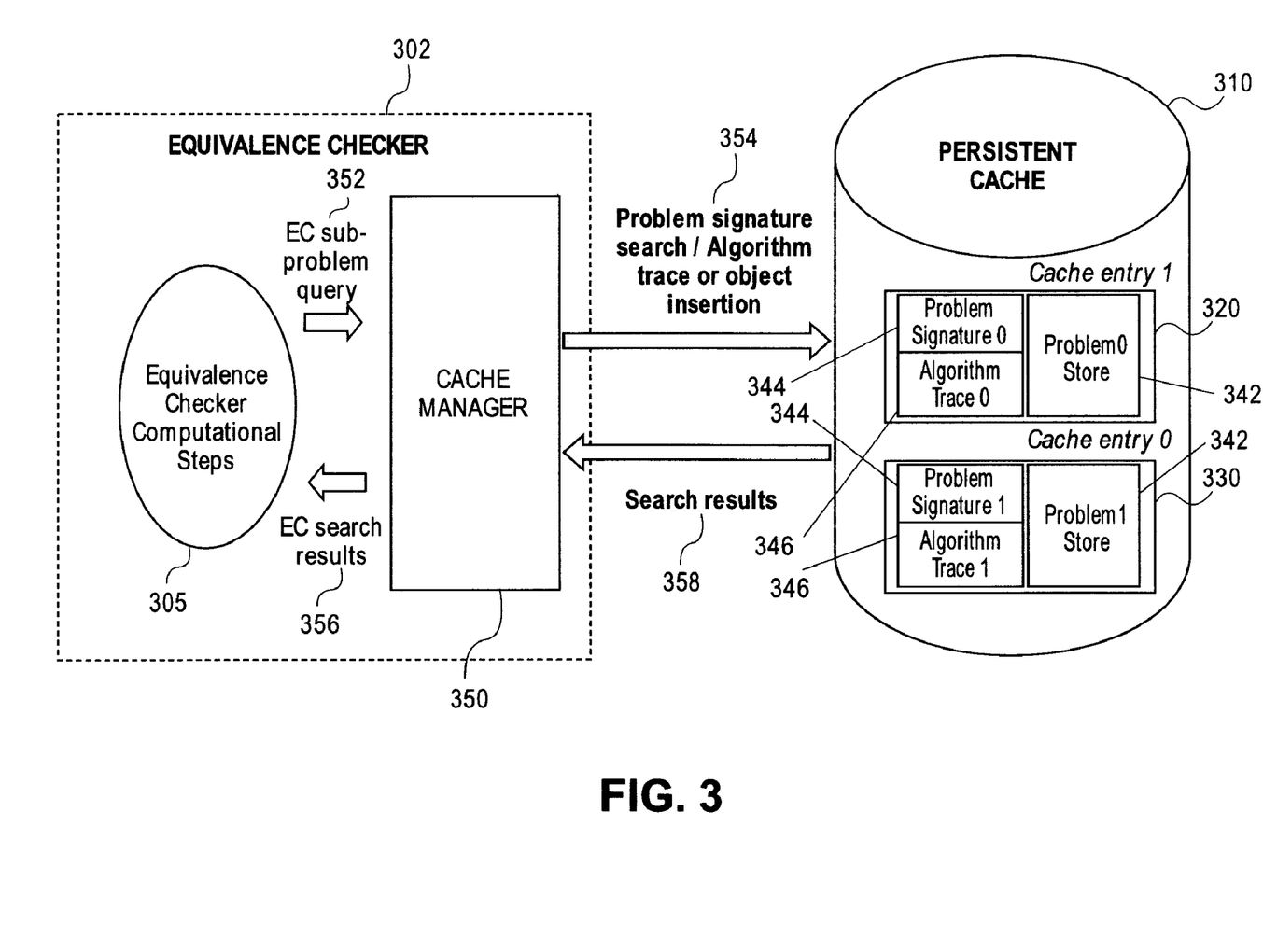
FIG. 3 illustrates an example of the high-level framework for this adaptive learning.

Some embodiments make use of adaptive learning based on persistent caches to improve EC performance. FIG. 3 illustrates an example of a high-level framework for this adaptive learning.

The following items can make up the some components of this framework:

Persistent cache 310 containing cached objects. Cached object 1 320 and cached object 0 330 are shown in the persistent cache 310. Objects can be of multiple types to represent cached solutions to different kinds of sub-problems such as logic cone equivalence, mapping results and/or logic cone simulation sensitivity vectors.

In this example, cached objects 1 320 and 0 330 each include a problem signature 344, an algorithm trace 346, and optionally the stored problem 342. Objects can be of different types and/or the same types for different sub-problems.

The computational steps 305 of the equivalence checker 302 can generate queries and receive results. Cache manager 350 that accepts EC sub-problem queries 352 looks up the persistent cache 354 and returns object search results 356 (depending on the search results 358 returned from the persistent cache 310). In addition, it updates the cache with new objects when results become available. For example, cached objects can be added, removed, changed, and/or replaced.

This technique can be applied to, for example, the problem of logic cone comparison.

Objects in Persistent Cache

A cached object contains the results of one or more past EC sub-problem computations. Each object includes a problem signature, an algorithm trace and/or a problem store. The problem signature, algorithm trace and/or problem store can be stored together or separately.

A problem signature captures the "characteristic" of the problem that can be used to perform fast tests to identify if two instances of the problem are identical. For example, in the problem of determining if two logic cones are identical, multiple signature types are possible:

1. Count of the primary inputs and outputs
2. Count of logic gates of each type in the cone in addition to primary IO count
3. Quasi-canonical number associated with graph coloring of the logic cone These signature types increase in precision from 1 to 3, but are accompanied by an increase in the computational effort required for the signature computation. The exact application of caching during EC and the requirement for precision in matching signatures implying identical problems can plat a role in deciding what signature is chosen for the application.

RTL expressions can also serve as signatures for logic cones. The logic cone signature can include the synthesized RTL expression and can allow matching of cones using mathematical properties for integer arithmetic such as commutative, associative, and/or distributive. For instance, two cones with signatures Y1=A+B+C and Y2=C+B+A can be treated as identical since their cone expressions are equal when taking into account that integer addition is associative. Associativity with addition of integers can hold, for example, as long as the sum of the operands can be represented with a number of bits smaller than the number of bits in an integer representation of the HDL.

In addition, a count of key point types that occur in RTL such as boundaries of RTL constructs can augment characteristics of the problem signature. These RTL construct boundaries may include control and data signals for case statements, control and data signals for ternary operators, as well as input and output signals of hierarchical boundaries.

Non-matching signatures can imply different problems. However, two different problems can have the same signature. If the sub-problem being solved requires that there is an exact match between a cached problem, and the new problem needed to be solved, then it becomes necessary to also include the problem store in the object. This is necessary for instance in the case of cached logic cone pairs from earlier EC runs being used in future EC runs. This is an exact cache match problem, which requires that the stored and the searched logic cone pairs have an exact match. The exact match can be in terms of topological matching—the names of the logic cone I/Os and nets do not have to match for classical graph coloring based isomorphism algorithms. In the case of caching sensitizing simulation vector run, it may not be necessary to have an exact cache match, and such an implementation choice would be an instance of the inexact cache match problem.

The algorithm trace contains the list and/or order of algorithms used for solving the specific problem instance and/or the algorithm intermediate values and/or final results. For instance, the sensitizing simulation vector run problem requires the sensitizing vector, the final algorithm result, as a part of the algorithm trace. A more complex problem however, such as the comparison of logic cones can require storing the exact algorithm(s) used, such as SAT, and/or the final cone comparison results, i.e., equivalent or non-equivalent. Items that can be included as a part of the algorithm trace are listed below:

1. Don't care model: 3 valued/symbolic
2. Compare result: Equivalent (EQ) Non Equivalent (NEQ)/Abort
3. Phase: Positive/Negative
4. Algorithms tried: BDD/SAT/resource limitations in force (# BDD nodes/# conflict/decisions)
5. Algorithm succeeded: BDD/SAT/resource limitations in force (# BDD nodes/# conflict/decisions)

In addition, the cache one can be populated with predetermined problem signatures that can capture the "characteristic" of the problem that can be used to perform fast tests to identify if two instances of the problem are similar. These "pre-cached" signatures combined with fast tests can be used to speed up initial runs. For example, in the problem of determining if two cones are identical a predetermined algorithm trace may speed up the initial results. Pre-cached characteristic examples include:

1. Number of inputs
2. Number of intermediate signals
3. Count of logic gates of each type
4. RTL information (adders, multipliers, case statements)
5. Hierarchical information Cache Organization and Management The persistent cache system includes a cache manager which controls access to the cache including object search, insertion of new objects, and/or object deletion. The actual form of storage of the objects can have multiple variations ranging from one monolithic file for all objects to multiple independent files and/or directories for each type of object.

From time to time it may be necessary to delete entries in the cache to keep it a manageable size, and/or to ensure that space resources do not get exhausted. Multiple replacement policies are possible in this schema, including that on the basis of the start time of caching, and/or a least recently used (LRU) policy. Maintaining a timestamp of the logic cones can allow the implementation of this and/or other policies.

For determining if an object, or its signature, is in the cache, one can implement an in-memory signature table (which is a hash table) containing just the object signatures (or substantially the object signatures, or some other smaller version) to allow for fast lookups and/or decision making before accessing the cache in the secondary storage.

Persistent Cache for Logic Cone Compare

A persistent cache can be used to solve the problem of equivalence checking (EC) a pair of logic cones. EC is an NP-complete problem and practical implementations of EC involve the application of multiple algorithms. Typically low-cost algorithms such as structure hash and/or simulation are tried before higher cost algorithms such as BDD and/or SAT/ATPG based approaches. These in turn are applied before the highest cost algorithms including the partition based (e.g., cut-points based) algorithms. For similar cost of techniques, e.g., BDD and/or SAT, the order of application can be dynamically determined from the comparison algorithm trace. For example, if BDD (SAT) successfully proves the last comparison, then this order of BDD (SAT) is applied first to the current comparison, and then SAT (BDD) is applied if the first order fails.

Figure 4:
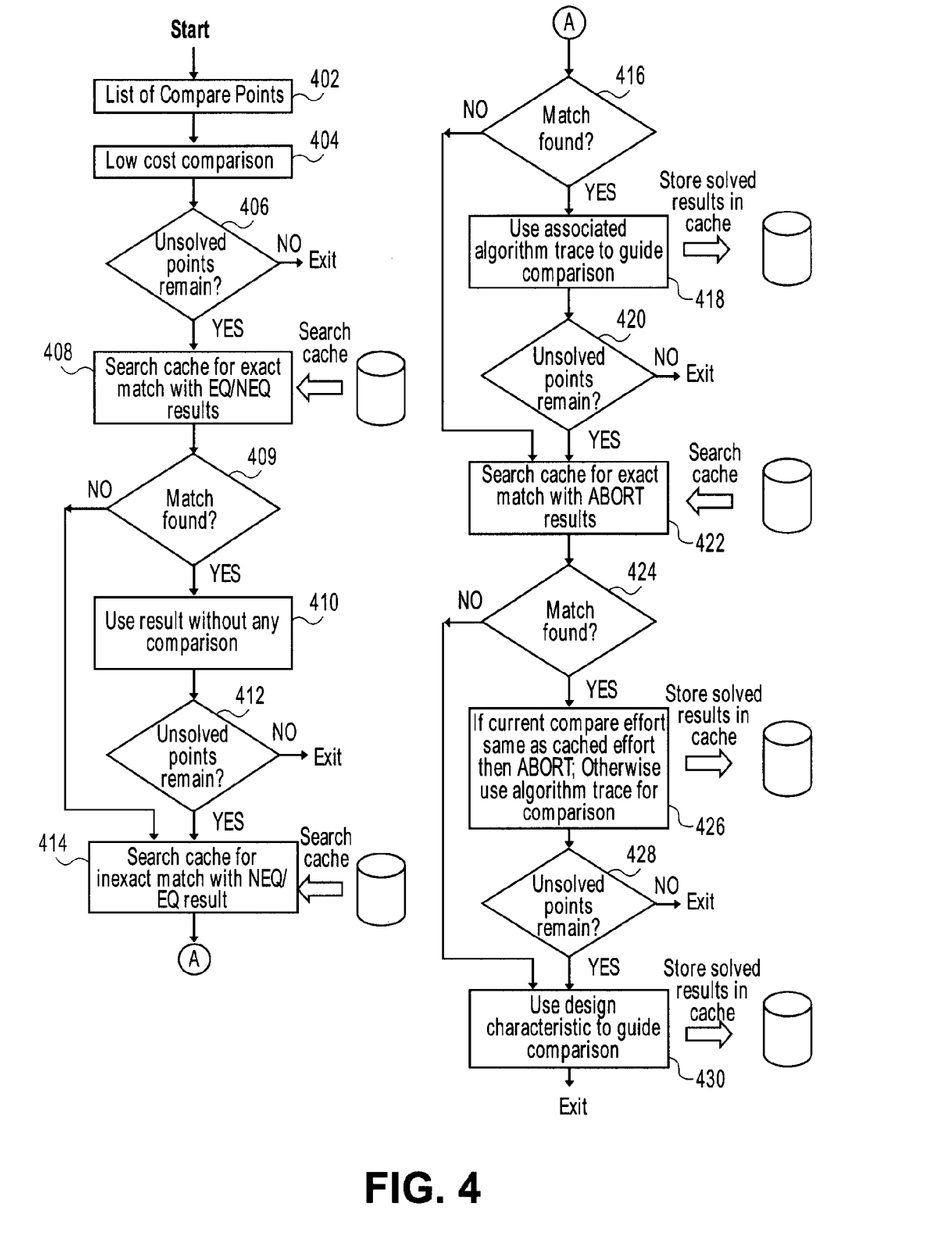
FIG. 4 shows an example of the EC solution flow with a persistent cache.

FIG. 4 shows an example of an EC solution flow with a persistent cache. Given a list of compare points 402, low cost comparison algorithms are tried first 404 before accessing the cache. These low cost algorithms such as structural hashing and/or limited cycle simulation will generally be faster than accessing and searching for the cones through the cache manager. Subsequently, if there still remain unsolved compare problems 406, then the cache is searched for exact match of problem signatures with EQ/NEQ results 408. For this class of problems, the results can be reused without further computation 410, if an exact match is found. Exit can occur if no unsolved points remain 412. After this stage, if there remain unsolved compare problems, then cache is searched for non-exact match of problem signatures with EQ/NEQ results 414. For this class of problems found 416, the associated algorithm traces can be used to guide the comparison 418. For example, if the result is NEQ, then its test vector can be tried first in the simulation stage. If the result is EQ, then the algorithm trace that solved the problem will be applied and this can help reduce trial-and-error techniques before the right algorithm is used. If the compare is successful, the compare results are cached.

If unsolved compare problems remain 420, the cache is searched for an exact match of problem signature with ABORT results 422. Following a match 424, if the compare effort setting is the same as before, then the ABORT result can be reused without further computation. Otherwise, the algorithm trace can be used to help determining the order of techniques to be applied and any new ABORT or EQ/NEQ results obtained is cached 426. If unsolved points remain, subsequently, design characteristic is used to guide comparison 430.

Figure 5:
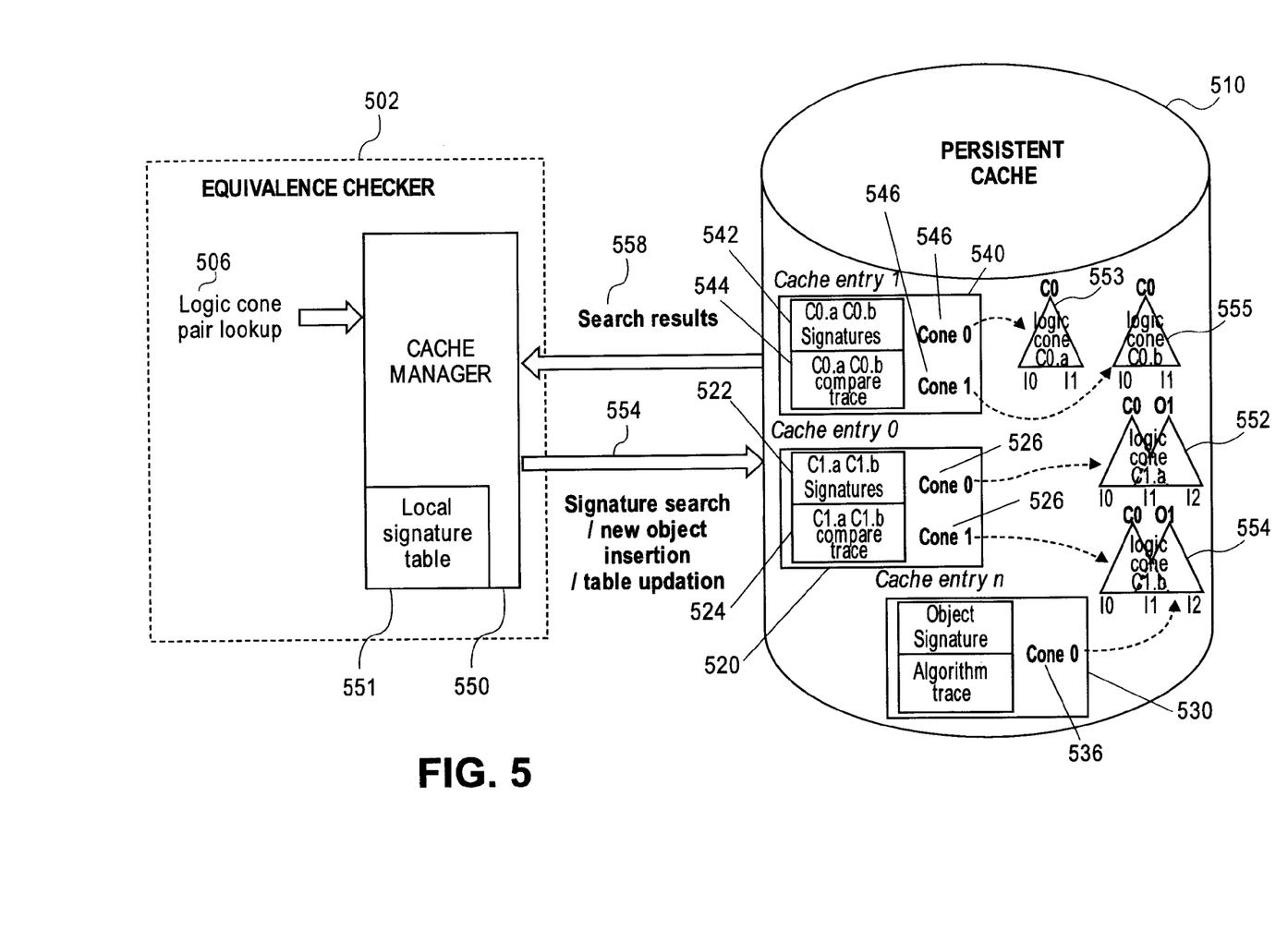
FIG. 5 illustrates a specific example for the overall logic cone compare process in the presence of a cache.

FIG. 5 illustrates a specific example for the overall logic cone compare process in the presence of a persistent cache. The basic object stored in the cache 510 is a logic cone pair together with a signature and the algorithm trace. As shown in the figure, cache entry 0 520 contains signatures 522 for logic cones C0.a, and C0.b, the algorithm trace for comparing these cones 524, and a reference 526 to the logic cones 552 and 554. Besides logic cone pairs, cache entries can represent result from other types of sub-problems. In the figure, cache entry n 530 contains a reference 536 to a single logic cone c1.b 554. Multiple cache entries can contain references to the same logic cones. For instance, cache entry 0 520 and cache entry n 530, both have references to the logic cone c1.b 554.

Also shown in FIG. 5 are equivalence checker 502 with cache manager 550 receiving logic cone pair lookup 506, search results 558 from persistent cache 510, sending signature search or new object insertion or table update 554 to persistent cache 510. Equivalence checker 502 can include local signature table 551. The persistent cache 510 further includes cache entry 1 540 with logic cone signatures 542, algorithm trace 544, and references 546 to logic cones 553 and 555.

Extraction of transitive properties can enable the combination of cache objects created during a series of comparisons. For example, a comparison of design A0 to A1 might yield the set of cache objects C01, and another comparison of design A1 to A2 might yield the set of cache objects C12. Design A1 is used in both comparisons. In this case, a set of cache objects can be predetermined before the comparison of A0 to A2 by extracting the transitive properties in the cache objects C01 and C12.

Transitive Combination of Persistent Cache Objects

Extraction of transitive properties can enable the combination of cache objects created during a series of comparisons. For example, a comparison of design A0 to A1 might yield the set of cache objects C01, and another comparison of design A1 to A2 might yield the set of cache objects C12. Notice that design A1 is used in both comparisons. In this case, a set of cache objects can be predetermined before the comparison of A0 to A2 by extracting the transitive properties in the cache objects C01 and C12.

An example of the transitive property is the correspondence of intermediate signals between two designs in a comparison. Suppose cache C01 contains the correspondence of the signal sa in A0 to the signal sb in A1, and cache C12 contains the correspondence of the signal sb in A1 to the signal sc in A2. Then the cache C02, for the purpose of comparing A0 to A2, can be predetermined with the correspondence of signal sa in A0 to the signal sc in A2.

This capability of combining the cache objects of a series of comparisons allows the comparison process to be broken down into a series of comparisons where each successive comparison involves designs with incremental changes. This enables the possible speed up of the overall process since now each comparison involves designs with smaller changes. Conversely, this capability makes possible the comparison of designs that have undergone significant changes by breaking the comparison into a series of simpler comparisons that need to be verified.

The references below are incorporated herein in their entirety:

A. Gupta. Formal Hardware Verification Methods: A Survey. Formal Methods in System Design, Vol. 1., 1992, pp 151-238.

D. L. Beatty, R. E. Bryant. Fast incremental circuit analysis using extracted hierarchy. Proceedings of the 25th ACM/IEEE conference on Design automation 1988, Atlantic City, N.J., United States.

J. R. Burch, V. Singhal: Tight integration of combinational verification methods. ICCAD 1998: 570-576.

A. Kuehlmann and F. Krohm, Equivalence checking using cuts and heaps, Proceedings of design automation conference, pp 263-268, June 1997.

W. Kunz, Hannibal: An efficient tool for logic verification based on recursive learning, Proceedings of International Conference on Computer Aided Design, pp 538-543, November 1993.

Chaff: Engineering an Efficient SAT Solver by M. Moskewicz, C. Madigan, Y. Zhao, L. Zhang, S. Malik, 39th Design Automation Conference, Las Vegas, June 2001.

U.S. Pat. No. 6,473,884.
U.S. Pat. No. 6,457,162.
U.S. Pat. No. 6,408,424.
U.S. Pat. No. 5,754,454.

Fielding, et al., RFC 2616, Hypertext Transfer Protocol—HTTP/1.1, www.ietf.org/rfc/rfc2616.txt, IETF, June 1999.

Smith, A. Acharya, T. Yang, H. Zhu, Exploiting Result Equivalence in Caching Dynamic Web Content, 1999 USENIX Symposium on Internet Technologies and Systems.

K. Kato, T. Masuda, Persistent Caching: An Implementation Technique for Complex Objects with Object Identity, IEEE Transactions on Software Engineering, July 1992 (Vol. 18, No. 7), pp. 631-645.

B. Liskov, M. Castro, L. Shrira, and A. Adya. Providing persistent objects in distributed systems in European Conference for Object-Oriented Programming (ECOOP), June 1999.

C. Ebeling, O. Zazicek, Validating VLSI circuit layout by wirelist comparison, ICCAD 1988.

What is claimed is:

1. A computer implemented method of circuit equivalence checking, comprising:
   solving at least a first equivalence checking problem, wherein the act of solving at least the first equivalence checking problem is performed by a processor;
   storing at least a first solution to at least the first equivalence checking problem;
   reusing at least part of the first solution to the first equivalence checking problem for a second equivalence checking problem,
   wherein the first equivalence checking problem includes comparing logic cones and the first solution includes one or more problem signatures,
   the first solution includes one or more stored problems, and
   the one or more stored problems permit matching between stored and searching logic cone pairs; and
   storing the one or more problem signatures in a memory.

2. The computer implemented method of claim 1, wherein the one or more problem signatures includes previously compared logic cones.

3. The computer implemented method of claim 1, wherein the one or more problem signatures includes hash values of previously compared logic cones.

4. The computer implemented method of claim 1, wherein the one or more problem signatures includes counts of primary inputs and primary outputs.

5. The computer implemented method of claim 1, wherein the one or more problem signatures includes counts of logic gates.

6. The computer implemented method of claim 5, wherein the one or more problem signatures includes counts of logic gates of different logic gate type.

7. The computer implemented method of claim 1, wherein the one or more problem signatures includes quasi canonical numbers associated with graph colorings of compared logic cones.

8. The computer implemented method of claim 1, wherein the one or more problem signatures includes RTL expressions.

9. The computer implemented method of claim 1, wherein the one or more problem signatures includes RTL key point type counts.

10. The computer implemented method of claim 1, wherein the one or more problem signatures includes RTL key point types.

11. The computer implemented method of claim 1, wherein the first solution includes one or more algorithm traces.

12. The computer implemented method of claim 11, wherein the one or more algorithm traces includes a list of algorithms used for comparing logic cones.

13. The computer implemented method of claim 11, wherein the one or more algorithm traces includes an order of algorithms used for comparing logic cones.

14. The computer implemented method of claim 11, wherein the one or more algorithm traces includes one or more intermediate values of algorithms used for comparing logic cones.

15. The computer implemented method of claim 11, wherein the one or more algorithm traces includes one or more final results of algorithms used for comparing logic cones.

16. The computer implemented method of claim 1, wherein the first solution includes one or more stored problems, wherein the one or more stored problems permit exact matching between stored and searched logic cone pairs.

17. An apparatus for circuit equivalence checking, comprising:
    a processor configured for solving at least a first equivalence checking problem;
    means for storing at least a first solution to at least the first equivalence checking problem;
    means for reusing at least part of the first solution to the first equivalence checking problem for a second equivalence checking problem,
    wherein the first equivalence checking problem includes comparing logic cones and wherein the first solution includes one or more problem signatures,
    the first solution includes one or more stored problems, and
    the one or more stored problems permit matching between stored and searched logic cone pairs; and
    a memory for storing the one or more problem signatures.

18. The apparatus of claim 17, wherein the one or more problem signatures includes previously compared logic cones.

19. The apparatus of claim 17, wherein the one or more problem signatures includes hash values of previously compared logic cones.

20. The apparatus of claim 17, wherein the one or more problem signatures includes quasi canonical numbers associated with graph colorings of compared logic cones.

21. A computer readable medium comprising a computer program stored in a storage medium or a memory medium which, when executed by a processing system, causes the processing system to perform the process of circuit equivalence checking, the process comprising:
    solving at least a first equivalence checking problem,
    wherein the act of solving at least the first equivalence checking problem is performed by a processor;
    storing at least a first solution to at least the first equivalence checking problem;
    reusing at least part of the first solution to the first equivalence checking problem for a second equivalence checking problem,
    wherein the first equivalence checking problem includes comparing logic cones and the first solution includes one or more problem signatures,
    the first solution includes one or more stored problems, and
    the one or more stored problems permit matching between stored and searched logic cone pairs; and
    storing the one or more problem signatures in a memory.

22. The medium of claim 21, wherein the one or more problem signatures includes previously compared logic cones.

23. The medium of claim 21, wherein the one or more problem signatures includes hash values of previously compared logic cones.

24. The medium of claim 21, wherein the one or more problem signatures includes quasi canonical numbers associated with graph colorings of compared logic cones.

25. The medium of claim 21, wherein the first solution includes one or more stored problems.

* * * * *